United States Patent [19]

Zupancic et al.

[11] Patent Number: 4,921,923

[45] Date of Patent: * May 1, 1990

[54] ETHERS OF OLIGOMERIC PHENOL-DIKETONE CONDENSATION PRODUCTS AND A VINYL-BENZYL COMPOUND

[75] Inventors: Joseph J. Zupancic, Bensenville, Ill.; Jean M. J. Frechet, Ithaca, N.Y.; Andrew M. Zweig, Schaumburg; Jeffrey P. Conrad, Chicago, both of Ill.

[73] Assignee: Allied Signal Inc., Morris Township, Morris County, N.J.

[ * ] Notice: The portion of the term of this patent subsequent to Mar. 28, 2006 has been disclaimed.

[21] Appl. No.: 272,954

[22] Filed: Nov. 18, 1988

Related U.S. Application Data

[63] Continuation-in-part of Ser. No. 126,313, Nov. 30, 1987, Pat. No. 4,816,498.

[51] Int. Cl.$^5$ .......................... C08G 2/02; C08G 2/34; C08G 8/02; C08G 8/36

[52] U.S. Cl. ..................................... 526/313; 522/135; 522/141; 522/147; 522/149; 522/162; 522/166; 522/178; 522/181; 526/243; 526/244; 526/247; 526/280; 526/286; 526/289; 526/291; 526/292.9; 526/293; 528/125; 528/128

[58] Field of Search ............... 522/135, 141, 147, 149, 522/162, 166, 178, 181; 526/243, 244, 247, 280, 286, 289, 291, 292.9, 293, 313; 528/125, 128

[56] References Cited

U.S. PATENT DOCUMENTS 4,448,952 5/1984 Patton, Jr. et al. ................. 528/154
4,816,498 3/1989 Zupancic et al. ................... 528/151

Primary Examiner—Morton Foelak
Assistant Examiner—Frederick Krass
Attorney, Agent, or Firm—Eugene I. Snyder; Harold N. Wells; Jay P. Friedenson

[57] ABSTRACT

Oligomeric condensation products of certain diketones and phenols can be end-capped with a vinylbenzyl moiety and certain other moieties, especially alkyl groups, to afford thermosetting resins particularly valuable in making laminated circuit boards. Resins prepared by the reaction of 1 molar proportion of diacetylbenzene with from 3.5 to 4.0 molar proportions of phenol and end-capped with from 50 to 100% vinylbenzyl groups with the remainder being alkyls of 1 through 11 carbon atoms are particularly useful.

28 Claims, No Drawings

ETHERS OF OLIGOMERIC PHENOL-DIKETONE CONDENSATION PRODUCTS AND A VINYL-BENZYL COMPOUND

CROSS REFERENCE TO RELATED APPLICATION

This application is a continuation-in-part of our co-pending application, Ser. No. 126,313, filed Nov. 30, 1987, now U.S. Pat. No. 4,816,498 all of which is hereby incorporated by reference.

BACKGROUND OF THE INVENTION

The subject matter of this application is directed toward resins used in the manufacture of reinforced plastics. More particularly, the resins (binders) are used in the preparation of composites formed from fibers embedded in a polymer resin matrix. Even more specifically this application is directed toward the use of such resins in the preparation of circuit board laminates where the reinforcing material is glass or quartz fiber.

To overcome some mechanical and structural limitations of plastics it has become relatively commonplace to reinforce them with other components. Composites formed of various fibers embedded in a polymer resin matrix are especially useful and susceptible to enormous variation depending upon the nature of the fiber used, how the fiber is utilized, and the matrix or binder for the fibers. Materials which have been used as fibers include glass, quartz, oriented polymers such as the aramids (Kevlar TM), graphite and boron. Whatever their composition such fibers can be used as chopped or continuous filaments, and when used as continuous filamnets they can all be unidirectional or woven into a fabric. The matrix can be, for example, a polyester, epoxy, polyimide, polyetherketone or polyetherimide resin as either a thermoset or thermoplastic material. The uses for such composites range from airframes to tennis rackets and from boat hulls to rocket motor casings.

A particular area of composite application is that of printed circuit boards, especially multilayer circuit boards, for mounting electronic components. The use of glass fabric as the reinforcing material has become more-or-less standard and epoxy resins are most often used as the matrix. For the fiber to exert a reinforcing action it is necessary that the fibers be completely coated with resin, and to achieve this the glass fiber often is surface treated to provide sites for chemical bonding to the resin or to its precursor or for otherwise improved adhesion to the matrix material.

Multilayer circuit boards are laminates with alternating layers of composite and etched copper sheet. A brief discussion of their manufacture will aid in appreciating the properties requisite for such boards. A woven glass fabric is first impregnated with resin by dipping the cloth in a resin solution, often referred to as the varnish solution, in what is called the A-stage. Solvent is then removed to afford a glass cloth reinforced resin, or prepreg, in what is called the B-stage. In some cases the resin in the prepreg may be partially cured, in other cases uncured, but in all cases the prepreg is a non-tacky, readily handled rigid sheet of glass cloth embedded in and coated with a resin. The finished circuit board is prepared by laminating alternating layers of prepreg and etched copper foil under conditions of temperature and pressure where resin is cured, i.e., further polymerized and crosslinked to a final infusible, insoluble stage (C-stage).

From the above brief description some necessary and desirable characteristics of the resin may be readily discerned. The circuit board will be subjected to soldering temperatures and may be operated at an elevated temperature, or experience cyclic locally elevated temperatures because of local power generation, and thus the thermal coefficient of expansion of the resin should approximate that of glass to ensure continued dimensional stability and resistance to heat distortion. The resin should have a high solubility in the varnish solution to ensure high resin loading. The varnish solution should have a sufficiently low viscosity for even coating but not too low a viscosity as to run off the fibers. It is necessary that the prepreg not be tacky so that it can be readily handled and stored. The resin is desirably non-crystalline for enhanced solubility in the varnish solution and for good film forming properties in the prepreg. The resin should have adequate flow at the C-stage so as to make void-free laminated bonds, with the curing temperature somewhat higher than the glass transition temperature ($T_g$) of the resin to afford a wider processing "window." The resin also should be chemically resistant to a corrosive environment and to water vapor. To ensure that the discrete electrical components on a circuit board interact only via the etched path on the copper foil, it is desirable that the matrix have a low dielectric constant and high resistance.

The invention to be described is an amorphous, thermosetting resin which affords a varnish solution of high solids content with a viscosity leading to even coating without runoff, which affords a non-tacky prepreg, has a glass transition temperature sufficiently below the curing temperature to afford an adequate window of processing, and which shows excellent flow properties at the C-stage. The final cured resin exhibits a low dielectric constant and dissipation factor, a low coefficient of thermal expansion, and a high glass transition temperature. In short, we believe our cured resin has properties superior to those currently recognized as industry standards in the lamination of circuit boards, and thus presents outstanding benefits.

It needs to be emphasized that although this application will stress the utilization of the resins of our invention in the production of multilayer circuit boards, the resins may be useful in fabricating composites generally. Consequently, it needs to be explicitly recognized that the resins of our invention are intended for composite manufacture without any limitations other than those imposed by the product specifications themselves.

SUMMARY OF THE INVENTION

The purpose of this invention is to prepare thermosetting resins which are suitable for use in composites, especially in laminated multilayer boards of a glass fiber in a polymer matrix. Another purpose of this invention is the preparation of highly crosslinked polymers arising from curing of the aforementioned thermosetting resins. An embodiment includes thermosetting resins of certain ethers of oligomeric condensation products of diketones with from about 3 to about 4 molar proportions of phenols. In a yet more specific embodiment the condensation product arises from phenol itself. In a more specific embodiment the ether is a mixture of a vinylbenzyl ether and an alkyl ether in a ratio from about 1:1 to about 6:1. In a still more specific embodiment the alkyl portion of the ether is a primary alkyl group containing from 1 to 10 carbon atoms. Other embodiments will become clear from the ensuing discussion.

DESCRIPTION OF THE INVENTION

This invention relates to thermosetting resins which are ethers of oligomeric condensation products of 1 molar proportion of certain diketones with from about 3 to about 4 molar proportions of a phenol. More particularly, the ether moiety is randomly selected from among the vinylbenzyl moiety, alkyl moieties containing from 1 to 10 carbon atoms, cycloalkyl moieties having from 5 to about 10 carbon atoms, and the benzyl moiety, where the ratio of the vinylbenzyl to other ether moieties is at least 1:1 and may be as great as 6:1.

Our invention is related to that described in Ser. No. 947,007 where the resins were exclusively the vinylbenzyl ethers of the oligomeric condensation product of certain phenols and dialdehydes, but a purpose of this invention is to overcome two problems inherent in the resins described there. One problem was that conversion of all of the phenolic hydroxyls to the vinylbenzyl ether was extraordinarily difficult as a consequence of steric hindrance, an effect which might be anticipated to be intensified with teh polyhalogenated derivatives of the condensation product. The presence of phenolic hydroxyl groups, even in amounts as small as 0.5% of the original number, is detrimental to product performance, especially as regards gel time, cure kinetics and schedule, dielectric constant and loss factor, and water absorption. The second problem is that conversion of the phenolic hydroxyls exclusively to the vinylbenzyl ether is rather costly.

There appears to be no teaching of a partial substitution of an alkyl or cycloalkyl group for the vinylbenzyl moiety and in fact careful consideration of such a substitution suggests it may be ineffective. One could expect that alkyl groups as ethers would act as plasticizers leading to a lower glass transition temperature ($T_g$) and a higher coefficient of thermal expansion, both of which are undesirable. A. Eisenberg, "The Glassy State and the Glass Transition", Physical Properties of Polymers, J. E. Mark et al., editors, (American Chemical Society), pp. 74 et ff. One also could expect that partial replacement of the vinylbenzyl groups by a non-crosslinkable alkyl or cycloalkyl group would adversely effect the thermal stability of the cured product, that is, the decomposition temperature of the crosslinked polymer, as a consequence of decreased crosslinking density and introduction of weaker bonds, i.e., benzylic hydrogens, alkyl carbons, etc.

However, gratifyingly and contrary to our expectations we have found that up to about 50% of the vinylbenzyl groups can be substituted by certain alkyl or cycloalkyl groups and the benzyl group without any detrimental effect and at a considerable cost savings. The products have virtually no free phenolic hydroxyls (less than about 0.5%) have a low dielectric constant, and have excellent thermal properties.

The phenolic oligomers are the condensation products of 1 molar proportion of selected diketones with from 3 to about 4 molar proportions of a phenol. Although more than 4 molar proportions of a phenol can be used in the practice of this invention, no more than 4 molar proportions will react with the diketones, as will be elaborated upon within.

One broad class of diketones which may be employed in the practice of this invention consists of carbocyclic diketones, such as cyclopentanedione, cyclohexanedione, cyclooctanedione, cyclononanedione, bicyclo[2.2.1]heptanedione, bicyclo[3.3.0]octanedione, bicyclo[3.4.0]nonanedione, bicyclo[4.4.0]decanedione, and so forth. Particularly interesting members of this class include 1,3-cyclopentanedione, 1,4-cyclohexanedione, 1,4-cycloheptanedione, 1,5-cyclooctanedione, bicyclo[2.2.1]heptane-2,5-dione, bicyclo[3.3.0]octane-3,7-dione, bicyclo[3.4.0]nonane-3,7-dione, bicyclo[4.4.0]decane-2,7-dione, and bicyclo[4.4.0]decane-3,8-dione.

Acyclic diketones also may be used in our invention, and suitable materials may be generically described a aromatic diketones. The aromatic diketones encompass materials of general structure 1 and 2. In structure 1 the aromatic nucleus can be benzene, naphthalene, anthracene, etc., where the aromatic ring may bear halogen atoms or alkyl groups containing up to about 10 carbons, and preferably no more than about 4 carbons, i.e., X=halogen or alkyl.

Diketones of generic structure 2 are characterized as di- or multiaromatic nucleus radicals where the aromatic radicals are bonded either directly (p=0) or via a bridging group (p=1), i.e., T=O, S, $CH_2$, $C(CH_3)_2$, $SO_2$,

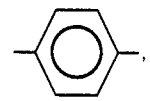

$—C(Me_2)_2C_6H_4C(Me_2)_2—$, etc.

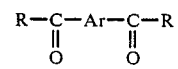

1

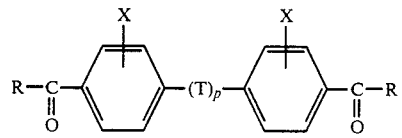

2

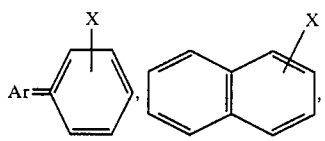

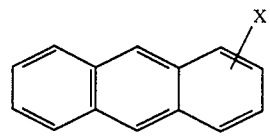

R = $CH_2$, $CH_3CH_2$, $CH_3CH_2CH_2$

Some examples of suitable diketones include 1,3-diacetylbenzene, 1,4-diacetylbenzene, 1,3-dipropionylbenzene, 1,4-dipropionylbenzene, 1,4-diacetylnaphthalene, 1,5-diacetylnaphthalene, 1,5-diacetylanthracene, 9,10-diacetylanthracene, 4,4'-diacetylbiphenyl, 3,4'-diacetylbiphenyl, 3,3'-diacetylbiphenyl, 4,4'-diacetyldiphenylether, 4,4'-dipropionylbiphenyl, 4,4'-diacetyldiphenylsulfone, and 4,4'-diacetyldiphenylmethane.

The oligomers are the condensation product of 1 molar proportion of the aforementioned diketones with from 3 to about 4 molar proportions of a phenol. The phenol is of the general structure $R_1C_6H_4OH$ where $R_1$ is hydrogen or an alkyl group containing from 1 through about 8 carbon atoms. The most desirable phenol is phenol itself, that is, the case where $R_1$ is hydrogen. Where $R_1$ is an alkyl group it is most desirable that the alkyl group contain from 1 to about 4 carbon atoms, and cresol, the case where $R_1$ is a methyl group is another preferred species of phenol.

The condensation product is analogous to phenol-formaldehyde resins. That is, the products result from the condensation of 2 molar proportions of a phenol with each ketone group. In the simplest case, which can be looked at as the "monomeric" product, using phenol and 1,4-diacetylbenzene to exemplify the reaction, the product has the structure

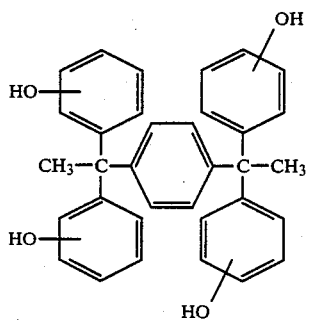

where the hydroxyls are almost exclusively ortho and para, and largely para, to the point of condensation of the phenol and 1,4-diacetylbenzene. However, the product above has 4 phenolic groups per molecule, and any one of these may react with another molecule of the diacetylbenzene which then further condenses with three other molecules of phenol to give the structure,

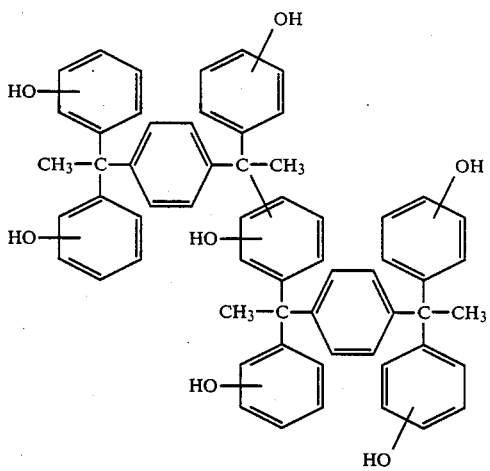

The oligomeric product above results from a molar proportion of 7 phenols to 2 diacetylbenzenes. This oligomer in turn can react with another molecule of diacetylbenzene and the latter can react further with 3 additional phenols to give the next higher oligomer of the structure

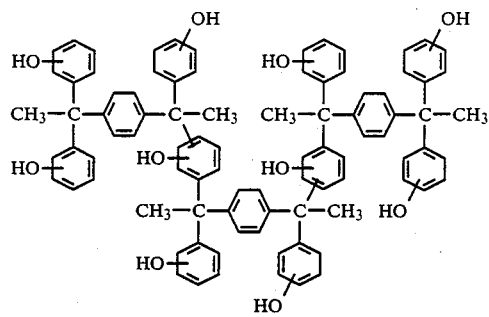

which has the molar ratio of 10 phenolic groups to 3 diacetylbenzene. In a similar fashion, the next higher oligomer has a molar ratio of phenol to diacetylbenzene of 13:4, the next higher of 16:5, and so forth, with the limiting molar ratio being 3:1. It needs to be mentioned that a ratio less than 3:1 will never be achieved without internal cyclization, i.e., one molecule of diacetylbenzene is required to react with at least 2 phenolic moieties of the oligomer. In a similar fashion, the condensation product which is the "monomer" has a limiting ratio of phenol-diacetylbenzene of 4:1.

The condensation products are themselves phenols, as mentioned above, and are a mixture of oligomers. This mixture can be characterized by the number of phenolic moieties per molecule. In the practice of this invention we are concerned with those condensation products which have from 4 to about 60 phenolic moieties per molecule, and more usually between four and about 22 phenolic moieties per molecule. The product being a mixture of oligomers, the preferred mixture is characterized by having as an average between about 4 and about 7 phenolic moieties per molecule.

The thermosetting resins of this invention are ethers of the aforedescribed oligomeric condensation products. In one variant of our invention the phenolic condensation products are halogenated prior to ether formation in order to make the final resins more flame retardant. Increased flame retardancy occurs especially when the halogen is chlorine or bromine, and the use of a brominated product is preferred. The halogen is introduced into positions ortho and para to the phenolic hydroxyl group. If all of the ortho and para positions are available a maximum of three halogen atoms per phenolic moiety may be introduced. Often it is desirable to prepare the maximally halogenated oligomeric condensation product, although at times a halogen content less than the maximum is advantageous. However, in the latter variant it should be clear that there is at least one chlorine or bromine atom per phenolic moiety.

The phenolic condensation products are capped so as to convert substantially all (greater than about 99.5%) of the hydroxyls to ether moieties. Each of the ether moieties is randomly selected from the group consisting of vinylbenzyl, alkyl containing 1 to 10 carbon atoms, cycloalkyl of from 5 to 10 carbon atoms, and benzyl moieties where the ratio of the vinylbenzyl to all other ether moieties is at least 1:1. All of the ether moieties may be vinylbenzyl, although more preferably only up to about 85% of the ether moieties are vinylbenzyl and may be as high as 6:1. The vinylbenzyl moiety has the structure

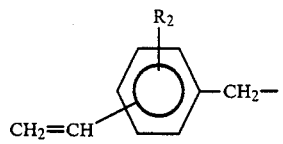

where the vinyl group is either meta or para to the $CH_2$, and which usually is a mixture of the meta and para-isomers. $R_2$ is a chemically inert substituent selected from the group consisting of hydrogen, alkyl moieties containing from 1 to about 10 carbon atoms, the halogens, alkoxy moieties containing from 1 to about 10 carbon atoms, and monovalent radicals whose parent is an aromatic hydrocarbon. In the usual case $R_2$ is hydrogen.

The other ether groups which may be used in the practice of this invention include an alkyl group containing from 1 to 10 carbons, a cycloalkyl group having 5 to 10 carbons, or a benzyl group. Where the ether moiety is an alkyl group, the lower alkyl groups containing from 1 to 4 carbon atoms are given priority, especially the primary alkyl groups. Thus, the most desirable alkyl groups consist of methyl, ethyl 1-propyl, 1-butyl, and 2-methyl-1-propyl. Other alkyl groups are represented by 1-pentyl, 1-hexyl, 1-heptyl, 1-octyl, 1-nonyl, 1-decyl, 2-methyl-1-butyl, 3-methyl-1-butyl, 2,3-dimethyl-1-butyl, 3,3-dimethyl-1-butyl, 2-methyl-1-pentyl, and so forth. However, it is to be emphasized that a benzyl group also operates quite satisfactorily in the practice of our invention. The most common cycloalkyl groups used in our invention are 5- and 6-membered cycloalkanes, unsubstituted or alkyl substituted so as to contain 5 to 10 carbon atoms. Examples are cyclopentyl, cyclohexyl, methylcyclopentyl, dimethylcyclopentyl, ethylcyclopentyl, propylcyclopentyl, butylcyclopentyl, pentylcyclopentyl, ethylmethylcyclopentyl, methylpropylcyclopentyl, butylmethylcyclopentyl, methylcyclohexyl, dimethylcyclohexyl, ethylcyclohexyl, propylcyclohexyl, butylcyclohexyl, and so forth. Alkyl groups containing 1 through about 4 carbon atoms are especially desirable, and among these the primary alkyl groups are particularly favored. It also needs to be mentioned that the vinylbenzyl and other ether moieties are randomly distributed among the aromatic rings.

The appended vinyl groups are readily crosslinked in a curing step effected by thermal, chemical, or radiative means. Thermal curing is generally done in the temperature range between about 110° and about 250° C., and in practice multilayer boards may be laminated at a temperature between about 150° and about 200° C. for 0.5–5 hours with post curing at about 180°–250° C. for about 0.5–24 hours. Curing also may be brought about using a free radical initiator, such as azo-bis-isobutyronitrile, benzoyl peroxide, di-t-butyl peroxide, etc. Curing may be effected as well by irradiation, especially by visible and ultraviolet light in the presence of a suitable photoinitiator. Whether thermal, chemical, or photochemical curing is performed, the resin becomes extensively crosslinked and sets to an infusible, insoluble glassy solid.

The resins of this invention may be prepared by any convenient method known in the art. The ethers are most readily prepared by reacting a vinylbenzyl halide with the phenolic condensation products followed by reaction of the partially etherified material with another suitable halide, such as an alkyl halide. However, an alternative to the sequential reaction is a reaction of a mixture of a vinylbenzyl halide with the oligomeric condensation products. Generally a mixture of the meta- and para-isomers of vinylbenzyl chloride are used, where the bromide and, to a lesser extent, the iodide also may be used. The reaction may be conveniently performed in an alcoholic potassium hydroxide solution, often containing a dipolar aprotic solvent such as N-methylpyrrolidone or some other organic cosolvent, at the reflux temperature.

The materials of our invention also can be blended with other types of vinylbenzyl ethers of functionality greater than or equal to 2 to provide A-stage varnish solutions with tailorable viscosity and variable properties in the cured product such as glass transition temperature, heat distortion temperature, fracture toughness, etc. For example, our resins could be blended with various styrenated bisphenols to raise crosslink density and improve processability of the bis-styryl compound. The materials of our invention are polymers of moderate functionality (i.e., number of vinylbenzyl groups per molecule) and viscosity and they can be incorporated to reduce crystallinity of various styrenated bisphenols where the bisphenols are exemplified by the formula

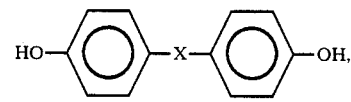

with X being —O—, —C(CH$_3$)$_2$—, —SO$_2$—, —O—, —CO—, and so forth to raise the resin solids content in the A-stage varnish solution, to raise the resin content in the B-stage, and to reduce the amount of resin flow in the C-stage. High-to-moderate molecular weight poly(vinylbenzyl ethers) also may be useful for improving the shelf life of other styrenated oligomers, and may raise the ductility of the otherwise brittle laminate, such as in the case of styrenated bisphenol A.

The following examples are only illustrative of this invention. Materials used therein are to be construed as only representative of those which can be used in the practice of our invention, and are not a limitation of the invention as claimed.

EXAMPLE I

Synthesis of α,α,α',α'-tetrakis(4-hydroxyphenyl)-1,4-diethylbenzene (TPDEB). To a 500 mL 3 neck round bottom flask fitted with a stirring shaft, thermometer, and a gas inlet tube was charged 141.0 g of phenol (1.50 mol), 19.0 g of p-diacetylbenzene (0.117 mol) and 1 mL butanethiol. The pot temperature was raised to 50° C. with the aid of a heating mantle and a solution was achieved. Hydrogen chloride was bubbled through the solution for 2.5 hours until a dark brown, viscous mass formed and stirring became ineffective. 250 mL of methanol were then added and the mixture filtered through a Buchner funnel and the precipitate washed with methanol yielding 42.9 g (73%) of a pale yellow solid; elemental analysis found: C 78.15, H 62.5, O 15.6; GPC: Mn=900, Mw=900, dispersity 1.0.

EXAMPLE II

Synthesis of Styrene Terminated α,α,α',α'-tetrakis(4-hydroxyphenyl)-1,4-diethylbenzene(100% Vinylbenzyl) (STTPDEB (100VBz)). To a 250 mL 3 neck round bottom flask was charged 18.0 g of α,α,α',α'-tetrakis(4-hydroxyphenyl)-1,4-diethylbenzene (0.0358 mol) and 130 mL methanol and a reflux condensor, stirring shaft, and heating mantle were brought into place. The flask was placed under nitrogen and 0.08 g butylated hydroxytoluene (BHT) (0.00036 mol) and 5.84 g sodium hydroxide (0.146 mol) were added and the mixture was brought to reflux. Upon dissolution, 22.28 g vinylbenzyl chloride (VBC) (0.146 mol) were added over 1 hour via a pressure equalizing dropping funnel. A precipitate began to form shortly after the addition of VBC was begun. The mixture was kept as reflux an additional 1.75 hours then quenched with 6 mL of water. The precipitate was collected on a Buchner funnel and washed $3 \times 130$ mL of water in a sonicating bath and then washed twice with 130 mL of methanol. The product was dried in a room temperature vacuum oven yielding 34.5 g (82%) of a pale yellow solid. GPC analysis found Mn=879, Mw=907, dispersity 1.03.

Neat Resin Properties:
Tm: 42° C., 102° C.
Polymerization Parameters:
$T_{onset}$: 150° C.
$T_{peak}$: 219° C.
$\Delta H_{polym}$: 87.4 J/g

EXAMPLE III

Curing and Properties of STTPDEB (100VBz). Approximately 3.0 grams of STTPDEB (100VBz) of Example II was dissolved in 10 mL of toluene and the sample was cured in a flat mold by heating at 80° C. for 2 hours, 100° C. for 16 hours, 120° C. for 4 hours, 160° C. for 16 hours, 200° C. for 4 hours and 225° C. for 1 hour. Analysis of the cured polymer disclosed the following properties.

TABLE 1

| $T_g(C)^a$ DSC | $T_{sp}(C)^b$ TMA | $\alpha_g{}^c$ (ppm/C) | $\alpha_{260}{}^d$ (ppm/C) | $\epsilon'/\tan\delta^{e,f}$ 0% RH | $\epsilon'/\tan\delta^{e,f}$ 50% RH | $H_2O^g$ absorption (wt %) |
|---|---|---|---|---|---|---|
| >300 | 146 ± 1 | 41 ± 2 | 68 ± 7 | 3.15/0.001 | 3.10/0.009 | 0.47 |

$^a$Glass Transition Temperature.
$^b$Softening Point.
$^c$Coefficient of Thermal Expansion from 25° C. to $T_{sp}$.
$^d$Coefficient of Thermal Expansion from 25° C. to 260° C.
$^e\epsilon'$ is the dielectric constant, tanδ the dissipation factor, measured at 1 MHz, 25° C. Parallel Plates.
$^f$Relative Humidity
$^g$Weight gain after two weeks at 50% Relative Humidity.

EXAMPLE IV

Synthesis of Styrene Terminated of α,α,α',α'-tetrakis(4-hydroxyphenyl)-1,4-diethylbenzene (75% Vinylbenzyl/25% Propyl) (STTPDEB (75VBz/25Pr)). To a 1 L 3 neck round bottom flask fitted with a stir bar, reflux condenser, heating mantle and pressure equalizing dropping funnel was charged 30.0 g of α,α,α',α'-tetrakis(4-hydroxyphenyl)-1,4-diethylbenzene (0.0597 mol), 27.32 g of VBC (0.179 mol), 0.13 g of BHT (0.00060 mol), and 350 mL of N-methyl-2-pyrrolidinone. The mixture was placed under nitrogen and brought to 60° C. A solution of 11.72 g of potassium hydroxide (0.183 mol) in 30 mL of methanol was added dropwise. The mixture was kept at 60° C. for 4 hours and then 7.6 mL of 1-bromopropane was added. A solution of 5.11 g potassium hydroxide (0.0796 mol) in 15 mL of methanol was then added dropwise. The mixture was kept at 60° C. for an additional two hours then allowed to cool.

400 mL of toluene were then added and the mixture transferred to a separatory funnel and washed 3;33 21 of water. The solution was dried over sodium sulfate and filtered. The solvent was rotary evaporated yielding 37.7 g (71%) of an amorphous yellow solid. GPC analysis found Mn=1100, Mw=1100, dispersity 1.0

Neat Resin Properties:
Polymerization Parameters:
$T_{onset}$: 109° C.
$T_{peak}$: 216° C.
$\Delta H_{polym}$: 135 J/g

EXAMPLE V

Curing and Properties of STTPDEB (75VBZ/25Pr). Approximately 3.0 grams of STTPDEB (75VBz/25Pr) of Example IV was dissolved in 10 mL of toluene and the sample was cured in a flat mold by heating at 80° C. for 2 hours, 100° C. for 16 hours, 120° C. for 4 hours, 160° C. for 16 hours, 200° C. for 4 hours and 225° C. for 1 hour. Analysis of the cured polymer disclosed the following properties.

TABLE 2

| $T_g(C)^a$ DSC | $T_{sp}(C)^b$ TMA | $\alpha_g{}^c$ (ppm/C) | $\alpha_{260}{}^d$ (ppm/C) | $\epsilon'/\tan\delta^{e,f}$ 0% RH | $\epsilon'/\tan\delta^{e,f}$ 50% RH | $H_2O^g$ absorption (wt %) |
|---|---|---|---|---|---|---|
| >300 | 172 ± 14 | 66 ± 3 | 84 ± 7 | 2.95/0.0007 | 2.98/0.002 | 0.09 |

$^a$Glass Transition Temperature.
$^b$Softening Point.
$^c$Coefficient of Thermal Expansion from 25° C. to $T_{sp}$.
$^d$Coefficient of Thermal Expansion from 25° C. to 260° C.
$^e\epsilon'$ is the dielectric constant, tanδ the dissipation factor, measured at 1 MHz, 25° C., Two-Fluid Cell.
$^f$Relative Humidity
$^g$Weight gain after two weeks at 50% Relative Humidity.

What is claimed is:
1. A thermosetting resin of an ether of the oligomeric condensation product of 1 molar proportion of a diketone, said diketone selected from the group consisting of cyclopentanediones, cyclohexanediones, cycloheptanediones, cyclooctanediones, bicyclo[2.2.1]heptanediones, bicyclo[3.3.0]cyclooctanediones, and acyclic ketones of formulae

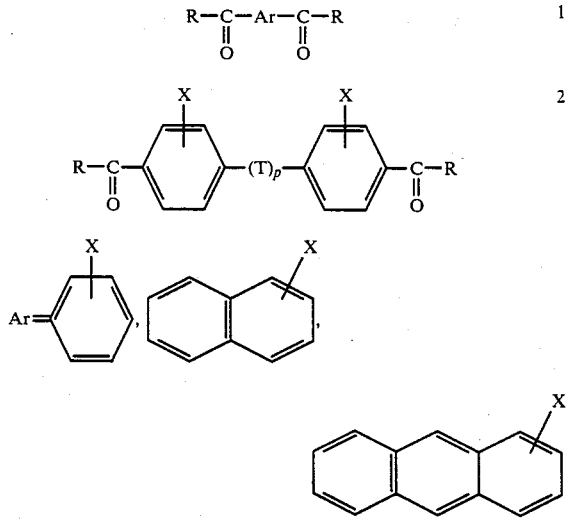

-continued

R = CH₂, CH₃CH₂, CH₃CH₂CH₂ where
X=halogen or alkyl containing up to about 10 carbon atoms;
p=0 or 1;
T=O, S, CH₂, (CH₃)₂C, SO₂, C₆H₄, or (CH₃)₂CC₆H₄C(CH₃)₂;
with from about 3 to about 4 molar proportions of a phenol of structure R₁C₆H₄OH where R₁ is hydrogen or an alkyl group containing from 1 to about 10 carbon atoms, and where the ether moiety is randomly selected from the group consisting of vinylbenzyl, alkyl moieties containing from 1 to 10 carbon atoms, cycloalkyl moieties of 5 to 10 carbon atoms, and benzyl, with the ratio of vinylbenzyl to other moieties being at least 1:1.

2. The resin of claim 1 where the diketone is selected from the group consisting of 1,3-cyclopentanedione, 1,4-cyclohexanedione, 1,4-cycloheptanedione, 1,5-cyclooctanedione, bicyclo[2.2.1]heptane-2,5-dione and bicyclo[3.3.0]octane-3,7-dione, diacetylbenzene and diacetylbiphenyl.

3. The resin of claim 2 where the diketone is 1,4-diacetylbenzene.

4. The resin of claim 2 where the diketone is 1,3-diacetylbenzene.

5. The resin of claim 1 where the phenol is phenol.

6. The resin of claim 1 where the phenol is cresol.

7. The resin of claim 1 further characterized in that each oligomeric condensation product has from about 4 to about 60 phenol moieties per molecule.

8. The resin of claim 7 where the condensation product has from 4 to about 22 phenolic moieties per molecule.

9. The resin of claim 8 further characterized in that the oligomeric condensation products have an average from about 4 to about 7 phenolic moieties per molecule.

10. The resin of claim 1 further characterized in that each aromatic ring of the oligomeric condensation product has from 1 to about 3 bromine or chlorine atoms.

11. The resin of claim 1 where the other ether moieties are selected from the group consisting of alkyl moieties having 1 through about 4 carbon atoms.

12. The resin of claim 1 where the alkyl moiety is a primary alkyl moiety.

13. A mixture of thermosetting resins of ethers of the oligomeric condensation products of 1 molar proportion of a diketone, said diketone selected from the group consisting of cyclopentanediones, cyclohexanediones, cycloheptanediones, cyclooctanediones, bicyclo[2.2.1]heptanediones, bicyclo[3.3.0]cyclooctanediones, and acyclic ketones of formulae R—C—Ar—C—R
‖       ‖
O       O

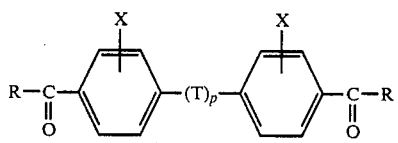

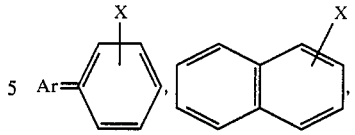,

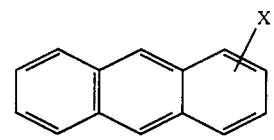

R = CH₂, CH₃CH₂, CH₃CH₂CH₂ where
X=halogen or alkyl containing up to about 10 carbon atoms;
p=0 or 1;
T=O, S, CH₂, (CH₃)₂C, SO₂, C₆H₄, or (CH₃)₂CC₆H₄C(CH₃)₂;
with from about 3 to about 4 olar proportions of a phenol of structure R₁C₆H₄OH where R₁ is hydrogen or an alkyl group containing from 1 to about 10 carbon atoms, and where the ether miety is randomly selected from the group consisting of vinylbenzyl, alkyl moieties containing from 1 to 10 carbon atoms, cycloalkyl moieties of 5 to 10 carbon atoms, and benzyl, with the ratio of vinylbenzyl to other moieties being from 1:1 to about 6:1.

14. The mixture of claim 13 where the diketone is selected from the group consisting of 1,3-cyclopentanedione, 1,4-cyclohexanedione, 1,4-cycloheptanedione, 1,5-cyclooctanedione, bicyclo[2.2.1]heptane-2,5-dione and bicyclo[3.3.0]octane-3,7-dione, diacetylbenzene and diacetylbiphenyl.

15. The mixture of claim 14 where the diketone is 1,3-diacetylbenzene.

16. The mixture of claim 14 where the diketone is 1,4-diacetylbenzene.

17. The mixture of claim 13 where the phenol is phenol.

18. The mixture of claim 13 where the phenol is cresol.

19. The mixture of claim 13 further characterized in that each oligomeric condensation product has from about 4 to about 60 phenolic moieties per molecule.

20. The mixture of claim 19 where the condensation product has from 4 to about 22 phenolic moieties per molecule.

21. The mixture of claim 20 further characterized by having an average from about 4 to about 7 phenolic moieties per molecule.

22. The mixture of claim 13 further characterized in that each aromatic ring of the oligomeric condensation products has from 1 to about 3 bromine or chlorine atoms.

23. The mixture of claim 13 where the other ether moieties are selected from the group consisting of alkyl moieties having 1 through about 4 carbon atoms.

24. The mixture of claim 13 where the alkyl moiety is a primary alkyl moiety.

25. The polymer resulting from curing the mixture of resins of claim 13.

26. The polymer of claim 25 where curing is done thermally.

27. The polymer of claim 25 where curing is performed photochemically.

28. The polymer of claim 25 where the resin has been cured with the aid of a free radical initiator.

* * * * *

UNITED STATES PATENT AND TRADEMARK OFFICE
CERTIFICATE OF CORRECTION

PATENT NO. : 4,921,923
DATED : May 1, 1990
INVENTOR(S) : Zupancic et al.

It is certified that error appears in the above-identified patent and that said Letters Patent is hereby corrected as shown below:

Column 1, line 34: "filamnets" should read --filaments--
Column 3, line 24: "teh" should read --the--
Column 4, line 12: "a" should read --as--
         line 55: "R - $CH_2$," should read --R - $CH_3$,--
Column 7, line 24: after "ethyl" and before "1-propyl," insert --,--
Column 10: line 4: "3;33 21" should read --3x2 L--
Column 11, line 1: "R - $CH_2$," should read --R - $CH_3$,--
Column 12, line 14: "R - $CH_2$," should read --R - $CH_3$,--
         line 21: "olar" should read --molar--
         line 24: "miety" should read --moiety--

Signed and Sealed this

Seventh Day of January, 1992

Attest:

HARRY F. MANBECK, JR.

*Attesting Officer*      *Commissioner of Patents and Trademarks*